US009646598B2

(12) United States Patent
Lee et al.

(10) Patent No.: US 9,646,598 B2
(45) Date of Patent: May 9, 2017

(54) AUDIO DEVICE

(71) Applicant: Samsung Electronics Co., Ltd., Suwon-si, Gyeonggi-do (KR)

(72) Inventors: Byoung-Hee Lee, Suwon-si (KR); Min-Woo Oh, Suwon-si (KR); Dong-Yup Lee, Suwon-si (KR); Kwang-Min Kil, Yongin-si (KR)

(73) Assignee: Samsung Elctronics Co., Ltd., Suwon-si (KR)

( * ) Notice: Subject to any disclaimer, the term of this patent is extended or adjusted under 35 U.S.C. 154(b) by 0 days.

(21) Appl. No.: 14/811,302

(22) Filed: Jul. 28, 2015

(65) Prior Publication Data

US 2016/0035342 A1     Feb. 4, 2016

(30) Foreign Application Priority Data

Jul. 30, 2014   (KR) .................. 10-2014-0097315

(51) Int. Cl.
  *G10K 11/16*     (2006.01)
  *G10K 11/178*    (2006.01)
  *H03G 3/34*      (2006.01)
  *H04R 1/10*      (2006.01)
  *H04R 5/033*     (2006.01)

(52) U.S. Cl.
  CPC ......... *G10K 11/1788* (2013.01); *H03G 3/348* (2013.01); *H04R 1/1041* (2013.01); *H04R 1/1083* (2013.01); *H04R 1/1091* (2013.01); *G10K 2210/1081* (2013.01); *G10K 2210/1082* (2013.01); *H04R 5/033* (2013.01); *H04R 2460/01* (2013.01)

(58) Field of Classification Search
  CPC .................. G10K 2210/1081; G10K 11/178
  USPC .................. 381/71.1, 71.6, 74, 309
  See application file for complete search history.

(56) References Cited

U.S. PATENT DOCUMENTS

| 9,332,339 B2 * | 5/2016 | Oliveira ............... H04R 1/1083 |
| 2007/0177741 A1 | 8/2007 | Williamson |
| 2010/0260362 A1 | 10/2010 | Sander et al. |
| 2011/0116646 A1 * | 5/2011 | Sander ................. H04R 1/1083 381/71.6 |

(Continued)

FOREIGN PATENT DOCUMENTS

| CN | 103248976 A | 8/2013 |
| CN | 103260105 A | 8/2013 |

(Continued)

*Primary Examiner* — Disler Paul
(74) *Attorney, Agent, or Firm* — Jefferson IP Law, LLP

(57) ABSTRACT

An audio device connected to an electronic device is provided. The audio device connected to an electronic device includes an audio side connector comprising a microphone terminal that outputs a microphone signal to the electronic device, at least one audio terminal that receives an audio signal from the electronic device, an active noise cancelling (ANC) terminal, and a ground terminal, an ANC block that is driven by power input from the electronic device to remove noise around the audio device, an ANC power source unit that is provided in the electronic device and applies power input via the ANC terminal to the ANC block as drive power, and an on/off switch unit that controls the ANC power source unit, wherein the ANC terminal is included in any one of the areas of the microphone terminal, the audio terminal, and the ground terminal.

34 Claims, 7 Drawing Sheets

(56) References Cited

U.S. PATENT DOCUMENTS

2011/0116751 A1* 5/2011 Terlizzi ................ G02B 6/3817
385/88
2015/0237435 A1 8/2015 Wong et al.

FOREIGN PATENT DOCUMENTS

| CN | 203251415 U | 10/2013 |
|----|-------------|---------|
| CN | 102291643 B | 3/2014 |
| WO | 99-08638 A1 | 2/1999 |
| WO | 2014/121576 A1 | 8/2014 |

* cited by examiner

AUDIO DEVICE

CROSS-REFERENCE TO RELATED APPLICATION(S)

This application claims the benefit under 35 U.S.C. §119(a) of a Korean patent application filed on Jul. 30, 2014 in the Korean Intellectual Property Office and assigned Serial No. 10-2014-0097315, the entire disclosure of which is hereby incorporated by reference.

TECHNICAL FIELD

The present disclosure relates to an audio device used while being connected to an electronic device.

BACKGROUND

An audio device, such as an earphone or earphones, an ear microphone, a headphone, a headset, etc., may be used while being connected to an electronic device. The audio device may include a speaker and may further include a microphone. The audio device including the speaker and the microphone may receive an audio signal from the electronic device to output audio through the speaker and may output an audio signal, input via the microphone, to the electronic device.

The audio device may further include additional function units, such as a radio reception block, an active noise cancelling block (hereinafter, referred to as an 'ANC block'), etc. The radio reception block may be used by a user to listen to a radio broadcast. The ANC block may be used to reduce noise around the audio device. The ANC block may reduce ambient noise by receiving an ambient sound, inverting the phase of the audio signal of the ambient sound, and then superimposing the inverted audio signal on an audio signal to be output through the speaker.

The microphone of the audio device may be driven by power supplied from the electronic device. The electronic device may supply electric power with a current of, for example, several mA, or 1 mA or less to the audio device in order to drive the microphone of the audio device. The additional function units, such as the radio reception block and the ANC block, require a higher consumption current than the microphone. For example, a current of about tens of mA is required to drive the ANC block.

An additional power line may be connected between the electronic device and the audio device in order to supply power for driving the ANC block from the electronic device to the audio device. The audio device may have an embedded battery for driving the ANC block, instead of receiving the power for driving the ANC block from the electronic device.

The audio device includes an audio device connector to connect to the electronic device. In addition, the electronic device also includes an electronic device connector to connect to the audio device.

The audio device connector has a jack shape based on the 3.5 mm standard, and the electronic device connector may be embodied as a socket shape. When the connector of the audio device having a jack shape is inserted into the connector of the electronic device having a socket shape, an L channel audio terminal, an R channel audio terminal, a ground terminal, and a microphone terminal, which are included in the audio device connector, are electrically connected to an L channel audio terminal, an R channel audio terminal, a ground terminal, and a microphone terminal, which are included in the electronic device connector, respectively.

Namely, the audio device connector and the electronic device connector are configured with a 4-pole connector.

The above information is presented as background information only to assist with an understanding of the present disclosure. No determination has been made, and no assertion is made, as to whether any of the above might be applicable as prior art with regard to the present disclosure.

SUMMARY

However, in cases where the audio device in the art has a battery embedded therein for driving the active noise cancelling (ANC) block which reduces noise around the audio device, the volume and weight of the audio device increase, and a user is inconvenienced by the maintenance of the battery. Further, the audio device of the related art has a disadvantage that the electronic device cannot control whether to drive the ANC block.

In order to address the above inconvenience and disadvantage, an audio device is required which can supply electric power to an ANC block without a battery therein, instead of modifying the structures of the existing audio device connector and the electronic device connector.

Aspects of the present disclosure are to address at least the above-mentioned problems and/or disadvantages and to provide at least the advantages described below. Accordingly, an aspect of the present disclosure is to provide an audio device in which an ANC terminal is configured in one of the terminals included in existing connectors (e.g., an earjack, a socket, etc.) of the audio device and an electronic device. As such, electric power for driving an ANC block of the audio device is supplied via the ANC terminal from the electronic device so that a battery included in the existing audio device for power supply is not required, thereby achieving the compactness and slimness of the audio device, and the maintenance of the battery is also not necessary, thereby enhancing the use of the audio device.

Another aspect of the present disclosure is to provide an audio device that can allow an electronic device to control whether to drive an ANC block of the audio device and can make low-power design possible, by configuring an on/off switch unit in the electronic device, wherein the on/off switch unit controls to supply power for driving the ANC block of the audio device from the electronic device to the audio device or cut off the power supply to the audio device.

Another aspect of the present disclosure is to provide an audio device that can be used to supply electric power not only to an ANC block, but also to other accessories (e.g., a lamp, a light emitting device, etc.) included in the audio device, by configuring ANC terminals in existing connectors of the audio device and an electronic device.

In accordance with an aspect of the present disclosure, an audio device connected to an electronic device is provided. The audio device includes an audio side connector including a microphone terminal, at least one audio terminal, an additional function terminal, and a ground terminal, an additional function unit that is driven by power input from the electronic device to execute an additional function, a power source unit that is provided in the electronic device and applies power input via the additional function terminal to the additional function unit as drive power, and an on/off switch unit that controls the power source unit, wherein the additional function terminal is included in any one of the microphone terminal, the audio terminal, and the ground terminal.

In accordance with another aspect of the present disclosure, an audio device connected to an electronic device is provided. The audio device includes an audio side connector including a microphone terminal that outputs a microphone signal to the electronic device, at least one audio terminal that receives an audio signal from the electronic device, an ANC terminal, and a ground terminal, an ANC block that is driven by power input from the electronic device to remove noise around the audio device, an ANC power source unit that is provided in the electronic device and applies power input via the ANC terminal to the ANC block as drive power, and an on/off switch unit that controls the ANC power source unit, wherein the ANC terminal is included in any one of the areas of the microphone terminal, the audio terminal, and the ground terminal.

In accordance with another aspect of the present disclosure, an audio device connected to an electronic device is provided. The audio device includes an audio side connector including a microphone terminal that outputs a microphone signal to the electronic device, at least one audio terminal that receives an audio signal from the electronic device, an ANC terminal, and a ground terminal, an ANC block that is driven by power input from the electronic device to remove noise around the audio device, an ANC power source unit that is provided in the electronic device and applies power input via the ANC terminal to the ANC block as drive power, and an on/off switch unit that controls the ANC power source unit, wherein the ANC terminal is included in the area of the microphone terminal.

In accordance with another aspect of the present disclosure, an audio device connected to an electronic device is provided. The audio device includes an audio side connector including a microphone terminal that outputs a microphone signal to the electronic device, at least one audio terminal that receives an audio signal from the electronic device, an ANC terminal, and a ground terminal, an ANC block that is driven by power input from the electronic device to remove noise around the audio device, an ANC power source unit that is provided in the electronic device and applies power input via the ANC terminal to the ANC block as drive power, and an on/off switch unit that controls the ANC power source unit, wherein the ANC terminal is included in the area of the ground terminal.

In accordance with another aspect of the present disclosure, an audio device connected to an electronic device is provided. The audio device includes an audio side connector including a microphone terminal that outputs a microphone signal to the electronic device, at least one audio terminal that receives an audio signal from the electronic device, a first and a second ANC terminal, and a ground terminal, an ANC block that is driven by power input from the electronic device to remove noise around the audio device, an ANC power source unit that is provided in the electronic device and applies power input via the ANC terminals to the ANC block as drive power, and an on/off switch unit that controls the ANC power source unit, wherein the first ANC terminal is included in the area of the audio terminal, and the second ANC terminal is included in the area of the microphone terminal.

In accordance with another aspect of the present disclosure, an audio device connected to an electronic device is provided. The audio device includes an audio side connector including a microphone terminal that outputs a microphone signal to the electronic device, at least one audio terminal that receives an audio signal from the electronic device, a first and a second ANC terminal, and a ground terminal, an ANC block that is driven by power input from the electronic device to remove noise around the audio device, an ANC power source unit that is provided in the electronic device and applies power input via the ANC terminals to the ANC block as drive power, and an on/off switch unit that controls the ANC power source unit, wherein the first ANC terminal is included in the area of the audio terminal, and the second ANC terminal is included in the area of the ground terminal.

In accordance with an aspect of the present disclosure, an ANC terminal is configured in one of the terminals included in existing connectors of an audio device and an electronic device, and power for driving an ANC block of the audio device is supplied via the ANC terminal from the electronic device in a state where the shapes of the existing connectors are maintained so that a battery for driving the existing ANC block does not have to be embedded in the audio device, thereby achieving the compactness and slimness of the audio device, and the additional maintenance of the battery is also not necessary, thereby reducing costs for the audio device. Furthermore, it is possible to listen to high-quality calls and music through the function of the ANC block in a noise situation, thereby enhancing the use of the audio device.

Moreover, an on/off switch unit may be included in the electronic device to control a supply of power for driving the ANC block of the audio device from the electronic device to the audio device or cut off the power supply to the audio device so that the electronic device can control whether to drive the ANC block of the audio device, and low-power design for the audio device is possible.

In addition, ANC terminals are configured in the existing connectors of the audio device and the electronic device so that the audio device can be used to supply electric power not only to the ANC block, but also to other accessories (e.g., a lamp, a light emitting device, etc.) included in the audio device.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
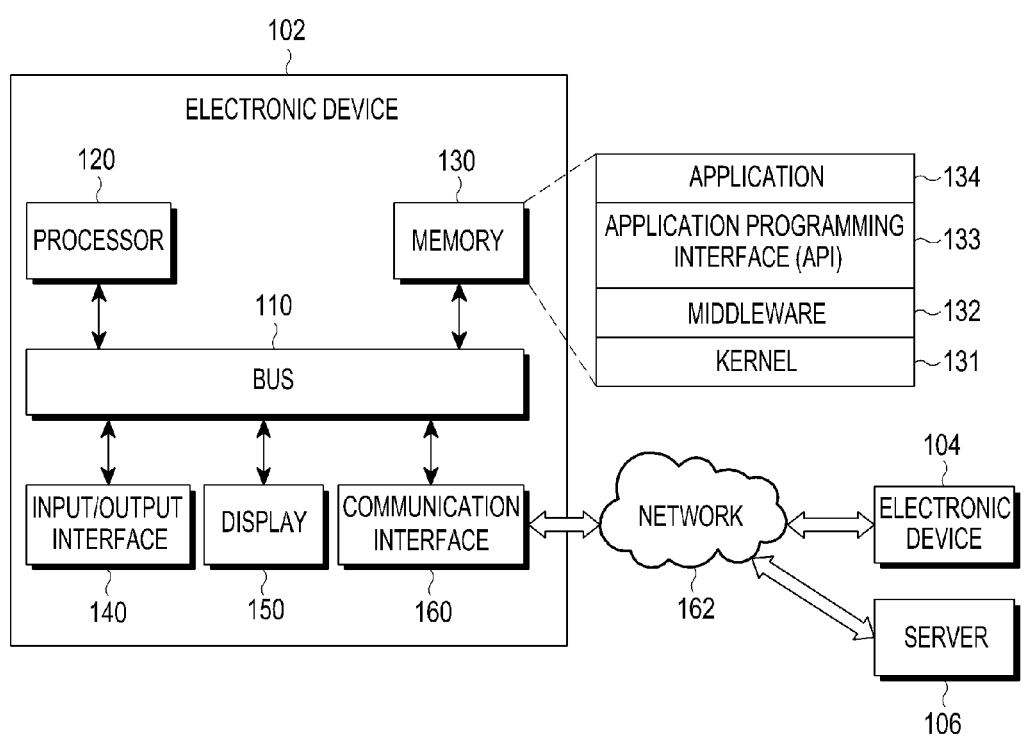
FIG. 1 is a block diagram illustrating a network environment including an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

With respect to the terms that are used to describe the various embodiments of the present disclosure, the general terms which are currently and widely used are selected in consideration of functions of structural elements in the various embodiments of the present disclosure. However, meanings of the terms may be changed according to an inventor's intention, a judicial precedent, appearance of a new technology, and the like. Further, in a certain case, a term arbitrarily selected by the applicant may be used. In such a case, the meaning of the term will be described at the corresponding part in the description of the present disclosure. Thus, the terms used in various embodiments of the present disclosure should be defined based on the meanings of the terms and the overall contents of the embodiments of the present disclosure instead of simple titles of the terms.

Although the terms including an ordinal number such as first, second, etc. can be used for describing various elements, the structural elements are not restricted by the terms. The terms are used merely for the purpose to distinguish an element from the other elements. For example, a first element could be termed a second element, and similarly, a second element could be also termed a first element without departing from the scope of the present disclosure.

Herein, an electronic device to be connected to an audio device, according to the various embodiments of the present disclosure, will be described. First, application examples of the electronic device, according to an embodiment of the present disclosure, may include not only all mobile communication terminals operating based on communication protocols corresponding to various communication systems but also all information communication devices, multimedia devices, and application devices thereof, such as a video telephone, an e-book reader, a laptop personal computer (PC), a netbook computer, a personal digital assistant (PDA), a portable multimedia player (PMP), an MPEG-1 audio layer-3 (MP3) player, a mobile medical device, a camera, a wearable device (e.g., a head mounted device (HMD) such as electronic glasses, electronic clothing, an electronic bracelet, an electronic necklace, an electronic appcessory, an electronic tattoo, or a smart watch), and the like.

According to some embodiments, the electronic device may be a smart home appliance. For example, the smart home appliance may include at least one of a television, a digital video disc (DVD) player, an audio, a refrigerator, an air conditioner, a vacuum cleaner, an oven, a microwave oven, a washing machine, an air cleaner, a set-top box, a television (TV) box (e.g., Samsung HomeSync™, Apple TV™, or Google TV™), a game console, an electronic dictionary, an electronic key, a camcorder, and an electronic photo frame.

According to some embodiments, the electronic device may include at least one of various medical devices (e.g., a magnetic resonance angiography (MRA), a magnetic resonance imaging (MRI), a computed tomography (CT) machine, and an ultrasonic machine), navigation devices, global positioning system (GPS) receivers, event data recorders (EDR), flight data recorders (FDR), vehicle infotainment devices, electronic devices for ships (e.g., navigation devices for ships, and gyro-compasses), avionics, security devices, automotive head units, robots for home or industry, automatic teller's machines (ATMs) in banks, or point of sales (POS) in shops.

According to some embodiments, the electronic device may include at least one of furniture or a part of a building/structure, an electronic board, an electronic signature receiving device, a projector, and various types of measuring devices (for example, a water meter, an electric meter, a gas meter, a radio wave meter and the like) including a camera function.

An electronic device according to various embodiments of the present disclosure may be a combination of one or more of above described various devices. Also, an electronic device according to various embodiments of the present disclosure may be a flexible device. Also, an electronic device according to various embodiments of the present disclosure is not limited to the above described devices.

The audio device, according to the various embodiments of the present disclosure, may include, for example, at least one of earphones, a headphone, and a headset. Further, it is apparent to those skilled in the art that the audio device, according to the various embodiments of the present disclosure, is not limited to earphones, a headphone, and a headset.

FIG. 1 illustrates a network environment including an electronic device according to various embodiments of the present disclosure.

Referring to FIG. 1, the electronic device 102 may include a bus 110, a processor 120, a memory 130, an input/output interface 140, a display 150, and a communication interface 160. The bus 110 may be a circuit for connecting elements of the electronic device 102 and transferring communication (e.g., a control message) between the elements.

The processor 120 may, for example, receive instructions from the other elements (e.g., the memory 130, the input/output interface 140, the display 150, the communication interface 160, etc.) through the bus 110, decode the received instructions, and execute operations or data processing based on the decoded instructions.

The memory 130 may store instructions or data received from, or generated by the processor 120 or the other elements (e.g., the input/output interface 140, the display 150, and the communication interface 160, etc.). The memory 130 may include, for example, programming modules, such as a kernel 131, middleware 132, an application programming interface (API) 133, applications 134, etc. The programming modules may be configured with software, firmware, hardware, or a combination of two or more thereof.

The kernel 131 may control or manage system resources (e.g., the bus 110, the processor 120, the memory 130, etc.) that are used to execute operations or functions implemented in the other programming modules, for example, the middleware 132, the API 133, and the applications 134. Further, the kernel 131 may provide an interface through which the middleware 132, the API 133, or the applications 134 access individual elements of the electronic device 102 to control or manage the elements.

The middleware 132 may function as an intermediary that makes the API 133 or the applications 134 communicate with the kernel 131 to exchange data. Further, in regard to task requests received from the applications 134, the middleware 132 may, for example, execute a control (e.g., scheduling or load balancing) for the task requests using a method of assigning a priority to use system resources of the electronic device 102 (e.g., the bus 110, the processor 120, the memory 130, etc.) to at least one of the applications 134.

The API 133 is an interface used, by the application 134, to control a function provided from the kernel 131 or the middleware 132, and may include, for example, at least one interface or function (e.g., instruction) for file control, window control, image processing, text control, etc.

According to various embodiments, the applications 134 may include a short message service (SMS)/multimedia message service (MMS) application, an e-mail application, a calendar application, an alarm application, a health care application (e.g., an application for measuring a work rate or blood sugar), an environment information application (e.g., an application for providing atmospheric pressure, humidity, or temperature information), etc. Additionally or alternatively, the applications 134 may be an application associated with information exchange between the electronic device 102 and an external electronic device (e.g., an electronic device 104). The application associated with information exchange may include, for example, a notification relay application for forwarding specific information to an external electronic device, or a device management application for managing an external electronic device.

For example, the notification relay application may have a function of forwarding, to an external electronic device (e.g., the electronic device 104), notification information generated from other applications of the electronic device 102 (e.g., an SMS/MMS application, an e-mail application, a health care application, an environmental information application, etc.). Additionally or alternatively, the notification relay application may, for example, receive notification information from an external electronic device (e.g., the electronic device 104) and provide the received notification information to a user. The device management application may, for example, manage (e.g., install, delete, or update) a function for at least a part of an external electronic device (e.g., the electronic device 104) communicating with the electronic device 102 (e.g., activating/deactivating the external electronic device itself (or some components thereof) or adjusting the brightness (or resolution) of a display), an application operating in the external electronic device, or a service provided from the external electronic device (e.g., a telephone call service or a message service).

According to various embodiments, the applications 134 may include an application specified according to the property (e.g., type) of an external electronic device (e.g., the electronic device 104). For example, in cases where the external electronic device is an MP3 player, the applications 134 may include an application relating to the reproduction of music. Similarly, in cases where the external electronic device is a mobile medical device, the applications 134 may include an application relating to health care. According to an embodiment, the applications 134 may include at least one of the applications specified to the electronic device 102 or applications received from an external electronic device (e.g., a server 106 or the electronic device 104).

The input/output interface 140 may forward instructions or data input by a user through an input/output device (e.g., a sensor, a keyboard, or a touch screen) to the processor 120, the memory 130, and the communication interface 160 through the bus 110. For example, the input/output interface 140 may provide the processor 120 with data corresponding to a user touch input through a touch screen. The input/output interface 140 may, for example, output instructions or data received through the bus 110 from the processor 120, the memory 130, and the communication interface 160, through an input/output device (e.g., a speaker or display). The input/output interface 140 may include an audio module. An audio device, such as earphones, a headphone, or a headset, may be connected to the audio module.

The display 150 may display various types of information (e.g., multimedia data, text data, etc.) to a user.

The communication interface 160 may connect communication between the electronic device 102 and an external device (e.g., the electronic device 104 or the server 106). For example, the communication interface 160 may be connected to a network 162 through wireless or wired communication to communicate with the external device. The wireless communication may include, for example, at least one of wireless fidelity (Wi-Fi), bluetooth (BT), near field communication (NFC), a GPS, and cellular communication (e.g., long term evolution (LTE), LTE-advanced (LTE-A), code division multiple access (CDMA), wideband CDMA (WCDMA), universal mobile telecommunications system (UMTS), wireless broadband (WiBro), global system for mobile communications (GSM), etc.). The wired communication may include, for example, at least one of a universal serial bus (USB), a high definition multimedia interface (HDMI), recommended standard 232 (RS-232), and a plain old telephone service (POTS).

According to an embodiment, the network 162 may be a telecommunication network. The telecommunication network may include at least one of a computer network, the Internet, Internet of Things, and a telephone network. According to an embodiment, a protocol for communication between the electronic device 102 and an external device (e.g., a transport layer protocol, a data link layer protocol, or a physical layer protocol) may be supported by at least one of the applications 134, the API 133, the middle ware 132, the kernel 131, and the communication interface 160.

According to various embodiments, a controller may include the processor 120 and the memory 130 for storing information required by the processor 120. The controller, as a central processing device, may control overall operations of the electronic device 102 and perform an operation of supplying electric power to an audio device according to an embodiment of the present disclosure as will be described below.

Hereinafter, an audio device, according to various embodiments of the present disclosure, may be configured with earphones. Although the earphones are described as an example of the audio device, the audio device is not limited thereto. Namely, any device through which listening to music is possible may be employed for the audio device in various manners. For example, the audio device may be configured with a headphone, a headset, or the like. In this embodiment, the earphones will be described as an application example of the audio device.

Accordingly, elements of the audio device have names beginning with 'audio', but are not limited thereto. That is, the elements of the audio device may also have names beginning with 'earphone.' For instance, an 'audio terminal' and an 'audio signal' may be mentioned as an 'earphone terminal' and an 'earphone signal.'

Further, an active noise cancelling (ANC) block will be described as an example of an additional function included in the audio device, but the additional information is not limited thereto. That is, any additional function that can be included in the audio device may be employed in various manners.

Figure 2:
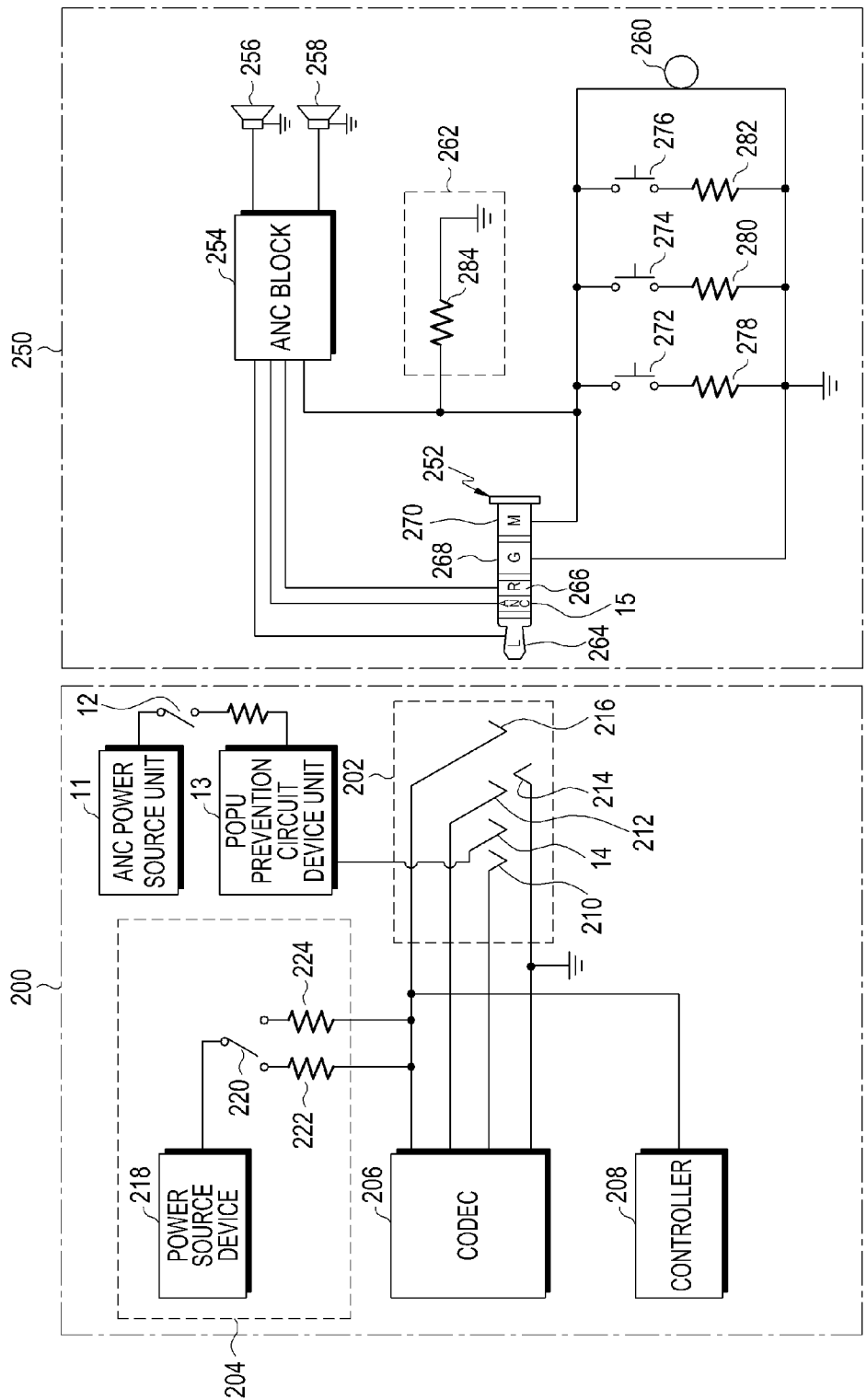
FIG. 2 is a block diagram illustrating an example in which an audio device is connected to an electronic device according to an embodiment of the present disclosure.

FIG. 2 is a block diagram illustrating an example in which an electronic device and audio device are connected to each other according to an embodiment of the present disclosure.

Referring to FIG. 2, earphones 250, which are an audio device, may be connected to an electronic device 200. FIG. 2 illustrates an example in which a 5-pole connector of the electronic device and a 5-pole connector of the earphones 250 are connected to each other, wherein the 5-pole connector of the electronic device includes an L channel audio terminal 210, an R channel audio terminal 212, a ground terminal 214, an ANC terminal 14, and a microphone terminal 216, and the 5-pole connector of the earphones 250 includes an L channel audio terminal 264, an R channel audio terminal 266, an ANC terminal 15, a ground terminal 268, and a microphone terminal 270.

The electronic device 200 may include an electronic device side connector 202, a power supply unit 204, a coder-decoder (CODEC) 206, a controller 208, an ANC power source unit 11, a popup prevention circuit device unit 13, and an on/off switch unit 12. The earphones 250 may include an audio side connector 252, an ANC block 254, an L channel speaker 256, an R channel speaker 258, a microphone 260, a type-setting unit 262, a volume up switch 272, a volume down switch 274, a send/end switch 276, and resistors 278, 280, 282.

The electronic device side connector 202 may include the L channel audio terminal 210 for outputting an L channel audio signal to the earphones 250, the R channel audio terminal 212 for outputting an R channel audio signal to the earphones 250, the ground terminal 214; the ANC terminal 14 for applying the power of the ANC power source unit 11 to the ANC block 254 of the earphones 250, and the microphone terminal 216 for receiving a microphone signal from the earphones 250.

The audio side connector 252 may include the L channel audio terminal 264 for receiving an L channel audio signal from the electronic device 200, the R channel audio terminal 266 for receiving an R channel audio signal from the electronic device 200, the ground terminal 268; the microphone terminal 270 for outputting a microphone signal to the electronic device 200, and the ANC terminal 15 for applying the power of the ANC power source unit 11 of the electronic device 200 to the ANC block 254 as drive power.

The on/off switch unit 12 may control to apply the power of the ANC power source unit 11 of the electronic device 200 to the ANC block 254 via the ANC terminals 14 of the electronic device side connector 202 and the ANC terminal 15 of the audio side connector 252.

For example, the audio side connector 252 may be implemented in the form of a jack, and the electronic device side connector 202 may be implemented in the form of a socket. When the electronic device side connector 202 of a socket form is inserted into the jack form of audio side connector 252, the L channel audio terminal 210, the R channel audio terminal 212, the ground terminal 214, the microphone terminal 216, and the ANC terminal 14 of the electronic device side connector 202 may be connected to the L channel audio terminal 264, the R channel audio terminal 266, the ground terminal 268, the microphone terminal 270, and the ANC terminal 15 of the audio side connector 252, respectively.

The terminals 210, 212, 214, 216, 15 of the electronic device side connector 202 may be connected to the codec 206. The CODEC 206 may output audio signals to the L channel audio terminal 210 and the R channel audio terminal 212 and receive a microphone signal from the microphone terminal 216.

The power supply unit 204 may be used as a drive power source of the microphone 260 of the earphones 250 via the microphone terminal 216, and the ANC power source unit 11 may be used as a drive power source of the ANC block 254 via the ANC terminals 14, 15.

The controller 208 may also be implemented by a processor, such as an application processor (AP), which may be included in the electronic device 200. For instance, the controller 208 may also be implemented by the processor 120 of the electronic device 102 illustrated in FIG. 1.

The controller 208 may input the voltage of the microphone terminal 216. In cases where the AP is used as the controller 208, the controller 208 may input the voltage of the microphone terminal 216 via an analog-to-digital converter (ADC). Therefore, the controller 208 may recognize the voltage which is input via an ADC port and converted into a digital value.

The controller 208 may control a power source device 218 of the power supply unit 204 to apply electric power to the microphone terminal 216.

The power supply unit 204 may include the power source device 218, a switch 220, and resistors 222, 224. The power supply unit 204 is operated by the controller 208 to generate electric power. The power source device 218 may be a power converter, such as low dropout, which generates electric power from a battery of the electronic device 200. The switch 220 and the resistors 222, 224 may be connected between the output end of the power source device 218 and the microphone terminal 216. The switch 220 may be controlled by the controller 208 to apply the output power of the power source device 218 to the microphone terminal 216 via one of the resistors 222, 224. Power is applied from the power source device 218 via the switch 220 and the resistor 222 to the microphone terminal 216 and is applied from the power source device 218 via the switch 220 and the resistor 224 to the microphone terminal 216.

The resistor 222 may have a higher resistance value than the resistor 224. The resistor 222 may have a resistance value corresponding to the consumption current of the microphone 260. The resistor 224 may have a resistance value corresponding to the consumption current of the ANC block 254. For example, the resistor 222 may have a resistance value of 2.21 kΩ, and the resistor 224 may have a resistance value of 100Ω.

The ANC terminal 15 of the audio side connector 252 may be connected to the ANC block 254. The ANC block 254 may be driven by the power input from the ANC power source unit 11 of the electronic device 200 via the ANC terminal 15. The ANC block 254 may perform an ANC process on an L channel audio signal and an R channel audio signal, which are input from the electronic device 200 via the L channel audio terminal 264 and the R channel audio terminal 266, and may output the processed L channel audio signal and R channel audio signal via the L channel speaker 256 and the R channel speaker 258, respectively.

The microphone 260, the pair of the volume up switch 272 and the resistor 278 connected in series to each other, the pair of the volume down switch 274 and the resistor 280 connected in series to each other, and the pair of the send/end switch 276 and the resistor 282 connected in series to each other may be connected in parallel to each other between the microphone terminal 270 and the ground terminal 268. The volume up switch 272, the volume down switch 274, and the send/end switch 276 may be an automatic reset contact type push button switch that is turned on when pressed and turned off when released. The volume up switch 272 may be used as a volume up key for indicating an increase in volume to the electronic device 200. The volume down switch 274 may be used as a volume down key for indicating a decrease in volume to the electronic device 200. The send/end switch 276 may be used as a send/end key for indicating a beginning and an end of a call.

The resistors 278, 280, 282 may have different resistance values. Therefore, in cases where the volume up switch 272, the volume down switch 274, and the send/end switch 276 are turned on, the voltage of the microphone terminal 216 may vary. For example, the resistor 278 may have a resistance value of 619Ω, the resistor 280 may have a resistance value of 221Ω, and the resistor 282 may have a resistance value of 50Ω. Accordingly, based on the voltage of the microphone terminal 216, the electronic device 200 may identify the type of switch which is turned on among the volume up switch 272, the volume down switch 274, and the send/end switch 276.

The type-setting unit 262 may be connected to the microphone terminal 270. The type-setting unit 262 may provide a voltage indicating that the earphones 250 are of a type including the ANC block 254 to the electronic device 200 via the microphone terminal 270. The type-setting unit 262 may include a resistor 284 connected between the microphone terminal 270 and the ground. The resistor 284 may have a different resistance value than the resistors 278, 280, 282.

If earphones not including the resistor 284 are connected to the electronic device 200, a voltage caused by the resistor 284 will not appear on the microphone terminal 216. Therefore, the electronic device 200 may identify whether the earphones 250 are of a type including the ANC block 254 on the basis of the voltage of the microphone terminal 216.

Among elements of an audio device and an electronic device, according to an embodiment of the present disclosure, connectors will be hereinafter described as follows.

Figure 3:
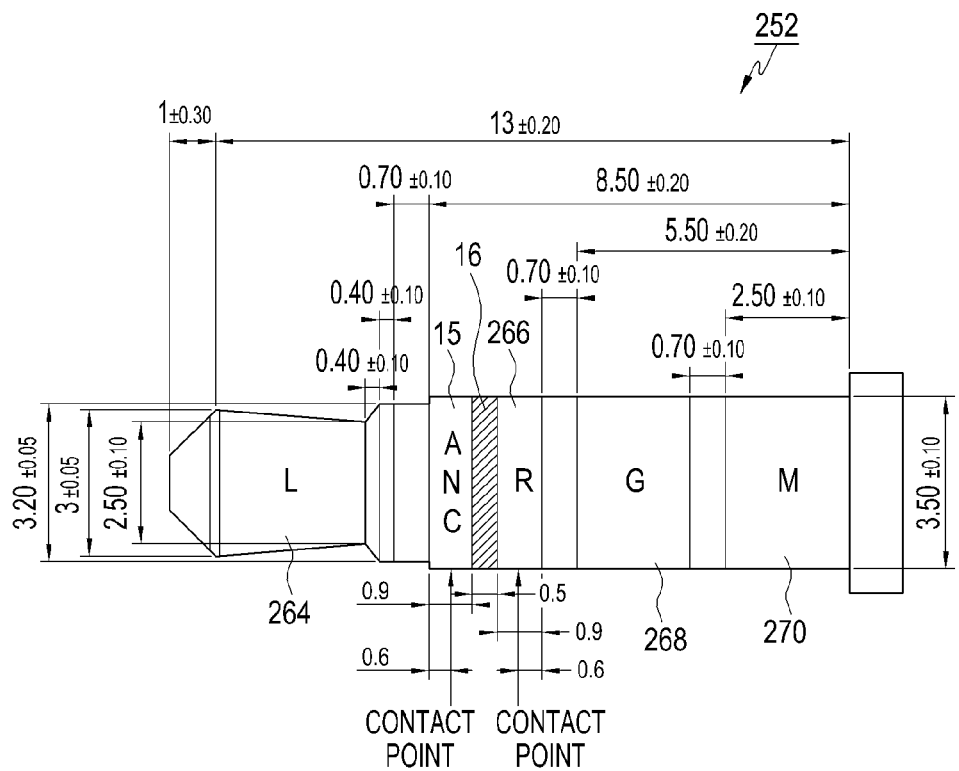
FIG. 3 is a side view illustrating a connector of an audio device according to an embodiment of the present disclosure.

FIG. 3 is a side view illustrating a connector of an audio device according to an embodiment of the present disclosure.

Figure 4:
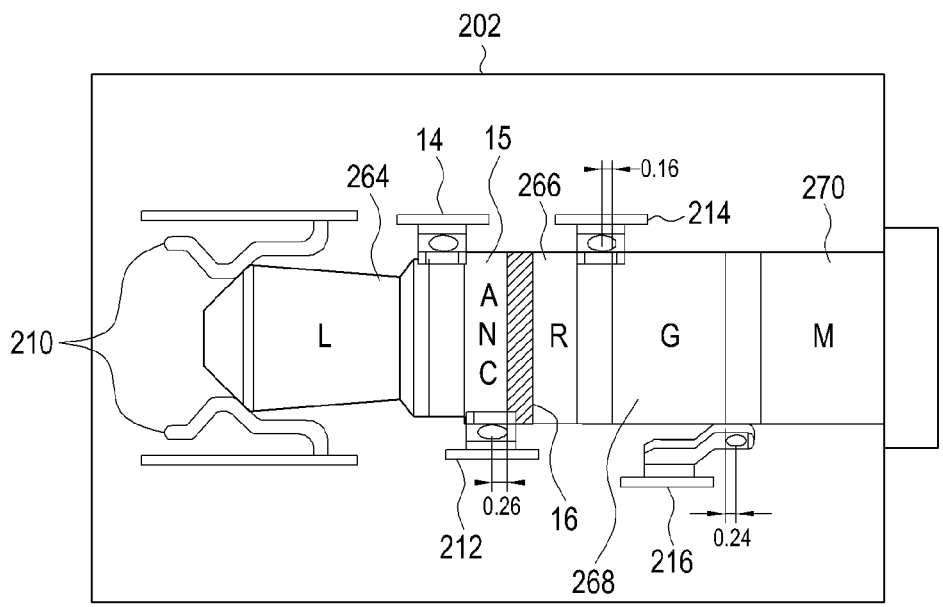
FIG. 4 is a side view illustrating a state where a connector of an audio device, such as the connector of the audio device illustrated in FIG. 3, is inserted into a connector of an electronic device according to an embodiment of the present disclosure.

FIG. 4 is a side view illustrating a state where a connector of an audio device, such as the connector of the audio device illustrated in FIG. 3, is inserted into a connector of an electronic device according to an embodiment of the present disclosure.

Referring to FIGS. 2 and 3, the audio device 250 includes the audio side connector 252, the ANC block 254, the ANC power source unit 11, and the on/off switch unit 12.

The audio side connector 252 may include the microphone terminal 270 for outputting a microphone signal to the electronic device 200, the L channel audio terminal 264 and the R channel audio terminal 266 for receiving an audio signal from the electronic device 200, and the ANC terminal 15 and the ground terminal 268 for applying power input from the electronic device 200 to the ANC block 254.

Referring to FIG. 2 mentioned above, the connectors 202, 252 of the electronic device 200 and the audio device 250 may be configured with a 5-pole connector that includes the L channel audio terminals 210, 264, the R channel audio terminals 212, 266, the ANC terminals 14, 15, the ground terminals 214, 268, and the microphone terminals 216, 270.

The ANC block 254 may be provided in the audio device 250 such that the ANC block 254 is driven by power input from the electronic device 200 to remove noise around the audio device 250.

The ANC power source unit 11 may be provided in the electronic device 200 to apply the power to the ANC block 254 via the ANC terminals 14, 15 as drive power.

The on/off switch unit 12 may be provided in the electronic device 200 to turn on/off the power of the ANC power source unit 11.

The ANC terminal 15 may be included in one of the area of the microphone terminal 270, the area of the L channel audio terminal 264, the area of the R channel audio terminal 266, and the area of the ground terminal 268.

In this embodiment, the ANC terminal 15 is included in the area of the R channel audio terminal 266.

Namely, in cases where the ANC terminal 15 is included in the area of the R channel audio terminal 266, a non-contact area 16 may be provided between the ANC terminal 15 and the R channel audio terminal 266 to partition the ANC terminal 15 and the R channel audio terminal 266.

Referring to FIG. 3, the audio side connector 252 may be configured with a 5-pole terminal while maintaining an existing jack shape based on the 3.5 mm standard as it is. In other words, the ANC terminal 15 of the audio side connector 252 may be included in the area of the existing R channel audio terminal 266 without a change in the size of the audio side connector 252.

Likewise, the electronic device side connector 202 may be configured in a socket shape of a 5-pole terminal to correspond to the audio side connector 252 configured with the 5-pole terminal. The ANC terminal 14 of the electronic device side connector may be electrically connected to the ANC terminal 15 of the audio side connector 252 without a change in the size of the electronic device side connector 202 due to the use of the existing ground terminal included in the electronic device side connector 202. In addition, specific dimensions of the size of the audio side connector 252 are disclosed as illustrated in FIG. 3.

Since the ANC terminal 15 is configured by including the non-contact area 16 in the area of the existing R channel audio terminal 266, it is possible to supply the power of the electronic device to the ANC block 254 of the audio device via the ANC terminal 15 while maintaining the shape of the existing connector of the audio device. Therefore, since an existing battery (not illustrated) included in the audio device is not required, compactness and slimness of the audio device 250 can be achieved, and since additional maintenance of the battery is also not necessary, costs for the audio device can be reduced.

Further, the electronic device 200 may include the popup prevention circuit device unit 13 which removes popup noise generated when the ANC power source unit 11 supplies electric power to the audio device 250 or cuts off the power supply via the on/off switch unit 12.

Namely, when electric power is applied to the ANC block 254 by the on/off switch unit 12, or the power is cut off by the on/off switch unit 12, a surge pulse may occur due to an unstable bias voltage of an internal circuit. The surge pulse may be amplified by a driving circuit and may generate uncomfortable noise through a speaker, etc. The noise is referred to as the popup noise.

The popup prevention circuit device unit 13 may remove such popup noise.

In this state, operations of the connectors of the audio device and the electronic device will be described in more detail with reference to FIG. 4 as follows.

Referring to FIG. 4, the connector 252 of the audio device having a jack shape is inserted into the connector 202 of the electronic device having a socket shape. At this time, the connector 252 of the audio device 250 is electrically connected to the connector 202 of the electronic device 200.

In other words, the L channel audio terminal 210, the R channel audio terminal 212, the ground terminal 214, the microphone terminal 216, and the ANC terminal 15 of the audio side connector 202 may be connected to the L channel audio terminal 264, the R channel audio terminal 266, the ground terminal 268, the microphone terminal 270, and the ANC terminal 14 of the electronic device side connector 252, respectively.

At this time, the ANC terminal 15 of the audio side connector and the ANC terminal 14 of the electronic device side connector 202 are electrically connected to each other.

As illustrated in FIG. 3, effective contact distances of the ANC terminal 15 and the R channel audio terminal 266 of the audio side connector may be 0.6 mm.

When a user presses an ANC drive key (not illustrated) included in the electronic device in this state to drive the ANC block, the on/off switch unit 12 is turned on and applies the power of the ANC power source unit 11 included in the electronic device to the ANC terminal 14 of the electronic device side connector 202, and the ANC terminal 14 applies the power to the ANC block 254 included in the audio device 250 via the ANC terminal 15 of the audio side connector to drive the ANC block 254.

At this time, the user can listen to high quality calls and music in such a noise situation at the same time that surrounding noise is removed through the driving of the ANC block 254.

In this state, in cases where the user does not use the ANC block 254, if the user presses the ANC drive key (not illustrated) included in the electronic device 200 again, the on/off switch unit 12 is turned off, and the power of the ANC power source unit 11 included in the electronic device 200 is cut off. At the same time, the ANC block 254 is not supplied with power. Accordingly, the ANC block 254 does not operate.

As described above, the user presses the ANC drive key (not illustrated) of the electronic device 200 to turn on/off the on/off switch unit 12, selecting the driving of the ANC block 254 so that the power for driving the ANC block 254 may be supplied from the electronic device 200 to the audio device, thereby achieving a low-power design of the audio device 250.

Here, a current of about tens of mA is required to drive the ANC block 254. For example, the current of the ANC block 254 may be 12 mA, but is not limited thereto. That is, the current of the ANC block may also be 12 mA or more, or 12 mA or less.

In addition, the ANC terminal 15 may supply electric power to an accessory (not illustrated) included in the audio device 250 as well as the ANC block 254. That is, the ANC terminal 15 is illustrated as a terminal for supplying electric power to the ANC block 254, but is not limited thereto. If the ANC terminal 15 is connected to a terminal of the accessory to supply the power of the ANC power source unit 11 of the electronic device 200 to the accessory, the ANC terminal 15 may be applied to various accessories. For instance, the accessory may be configured with a lamp, a light emitting device, etc.

Among elements of an audio device and an electronic device, according to another embodiment of the present disclosure, connectors will be hereinafter described as follows.

Also, repetitive descriptions of the electronic device 200 identical to ones given with reference to FIG. 2 will be omitted. In addition, repetitive descriptions of connectors 20, 30 of the present disclosure identical to ones of the connectors according to the preceding embodiment will be omitted, and the following description will be focused on differences therebetween.

Figure 5:
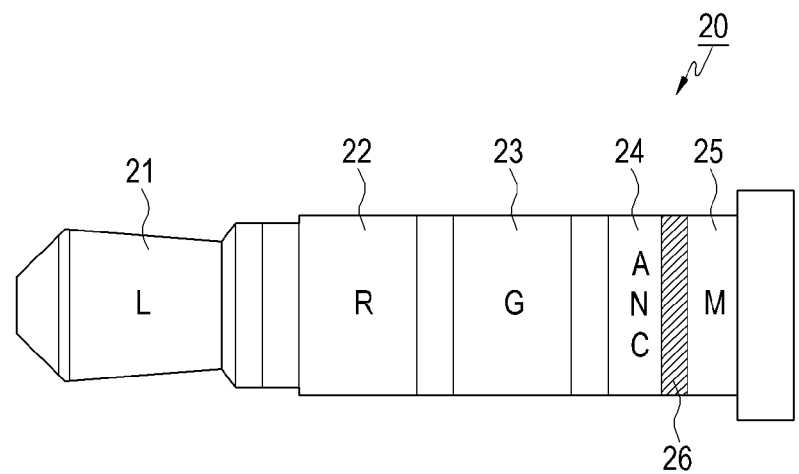
FIG. 5 is a side view illustrating a connector of an audio device according to an embodiment of the present disclosure.

FIG. 5 is a side view illustrating a connector of an audio device according to an embodiment of the present disclosure.

Figure 6:
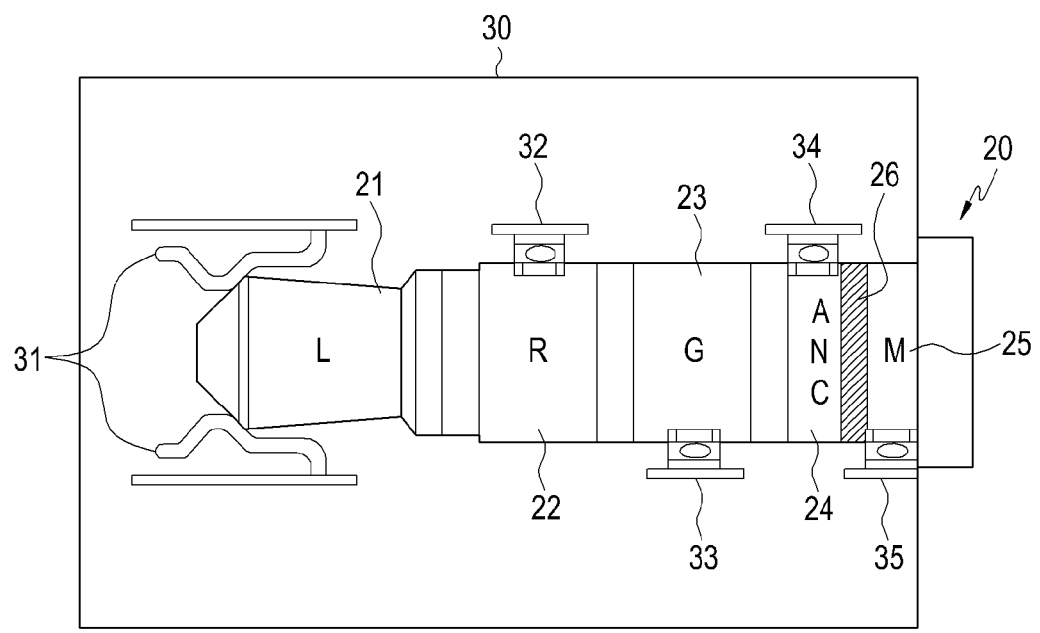
FIG. 6 is a side view illustrating a state where a connector of an audio device, such as the connector of the audio device illustrated in FIG. 5, is inserted into a connector of an electronic device according to an embodiment of the present disclosure.

FIG. 6 is a side view illustrating a state where a connector of an audio device, such as the connector of the audio device illustrated in FIG. 5, is inserted into a connector of an electronic device according to an embodiment of the present disclosure.

Referring to FIGS. 2 and 5, the audio device 250 includes the audio side connector 20, the ANC block 254, the ANC power source unit 11, and the on/off switch unit 12.

The audio side connector 20 may include a microphone terminal 25 for outputting a microphone signal to the electronic device 200 (illustrated in FIG. 2), an L channel audio terminal 21 and an R channel audio terminal 22 for receiving an audio signal from the electronic device 200, and an ANC terminal 24 and a ground terminal 23 for applying power input from the electronic device 200 to the ANC block 254 (illustrated in FIG. 2).

Referring to FIG. 2 mentioned above, the connectors 20, 30 of the electronic device 200 and the audio device 250 may be configured with a 5-pole connector that includes L channel audio terminals 21, 31, R channel audio terminals 22, 32, ANC terminals 24, 34, ground terminals 23, 33, and microphone terminals 25, 35.

The ANC block 254 (illustrated in FIG. 2) may be provided in the audio device 250 such that the ANC block 254 is driven by power input from the electronic device 200 to remove noise around the audio device 250.

The ANC power source unit 11 (illustrated in FIG. 2) may be provided in the electronic device 200 to apply the power to the ANC block 254 (illustrated in FIG. 2) via the ANC terminals 24, 34 as drive power.

The on/off switch unit 12 (illustrated in FIG. 2) may be provided in the electronic device 200 to turn on/off the power of the ANC power source unit.

In this embodiment, the ANC terminal 24 is included in the area of the microphone terminal 25.

Namely, in cases where the ANC terminal 24 is included in the area of the microphone terminal 25, a non-contact area 26 may be provided between the ANC terminal 24 and the microphone terminal 25 to partition the ANC terminal 24 and the microphone terminal 25.

Accordingly, the audio side connector 20 may be configured with a 5-pole terminal while maintaining an existing jack shape based on the 3.5 mm standard as it is.

Likewise, the electronic device side connector 30 may be configured in a socket shape of a 5-pole terminal to correspond to the audio side connector 20 configured with the 5-pole terminal.

Operations of the connectors 20, 30 of the audio device 250 and the electronic device 200 will be described in more detail with reference to FIGS. 2 and 6 as follows.

First, referring to FIGS. 2 and 6, the 5-pole terminal connector 20 of the audio device 250 having a jack shape is inserted into the 5-pole terminal connector 30 of the electronic device 200 having a socket shape. At this time, the connector 20 of the audio device 250 is electrically connected to the connector 30 of the electronic device 200.

In other words, the L channel audio terminal 21, the R channel audio terminal 22, the ground terminal 23, the microphone terminal 25, and the ANC terminal 24, included in the area of the microphone terminal 25, of the audio side 5-pole terminal connector 20 may be connected to the L channel audio terminal 31, the R channel audio terminal 32, the ground terminal 33, the microphone terminal 35, and the ANC terminal 34 of the electronic device side 5-pole terminal connector 30, respectively.

At this time, the ANC terminal 24 of the audio side connector 20 and the ANC terminal 34 of the electronic device side connector 30 are electrically connected to each other.

When a user presses an ANC drive key (not illustrated) included in the electronic device 200 in this state to drive the ANC block 254 (illustrated in FIG. 2), the on/off switch unit 12 is turned on and applies the power of the ANC power source unit 11 (illustrated in FIG. 2) included in the electronic device 200 (illustrated in FIG. 2) to the ANC terminal 34 of the electronic device side connector 30, and the ANC terminal 34 applies the power to the ANC block 254 (illustrated in FIG. 2) included in the audio device 250 via the ANC terminal 24 in the area of the microphone terminal 25 to drive the ANC block 254.

At this time, the user can listen to high quality calls and music in such a noise situation at the same time that surrounding noise is removed through the driving of the ANC block 254 (illustrated in FIG. 2).

In this state, in cases where the user does not use the ANC block, if the user presses the ANC drive key (not illustrated) included in the electronic device 200 again, the on/off switch unit 12 is turned off, and the power of the ANC power source unit 11 (illustrated in FIG. 2) included in the electronic device 200 is cut off. At the same time, the ANC block 254 (illustrated in FIG. 2) is not supplied with power. Accordingly, the ANC block 254 does not operate.

As described above, the ANC terminals are configured in the connectors of the audio device and the electronic device, respectively, and the ANC terminal is included in the area of the microphone terminal of the audio side connector at the same time so that electric power can be supplied from the electronic device to the ANC block of the audio device using the existing connector.

Among elements of an audio device and an electronic device, according to a further embodiment of the present disclosure, connectors will be hereinafter described as follows.

Also, repetitive descriptions of the electronic device 200 identical to ones given with reference to FIG. 2 will be omitted. In addition, repetitive descriptions of connectors 40, 50 of the present disclosure identical to ones of the connectors according to the preceding embodiments will be omitted, and the following description will be focused on differences therebetween.

Figure 7:
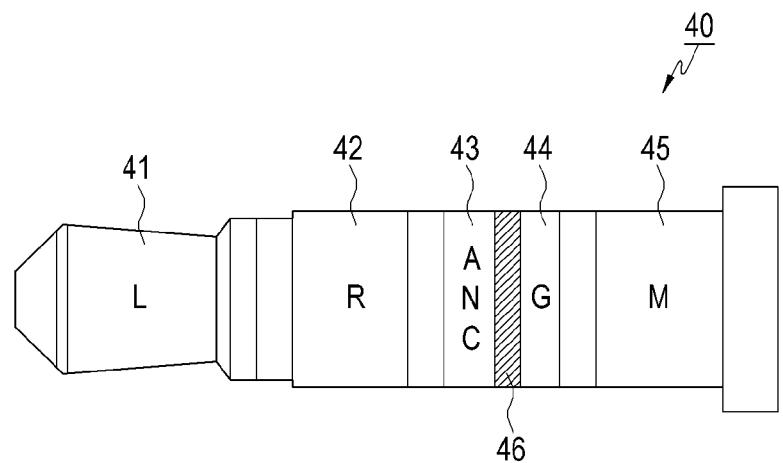
FIG. 7 is a side view illustrating a connector of an audio device according to an embodiment of the present disclosure.

FIG. 7 is a side view illustrating a connector of the audio device according to an embodiment of the present disclosure.

Figure 8:
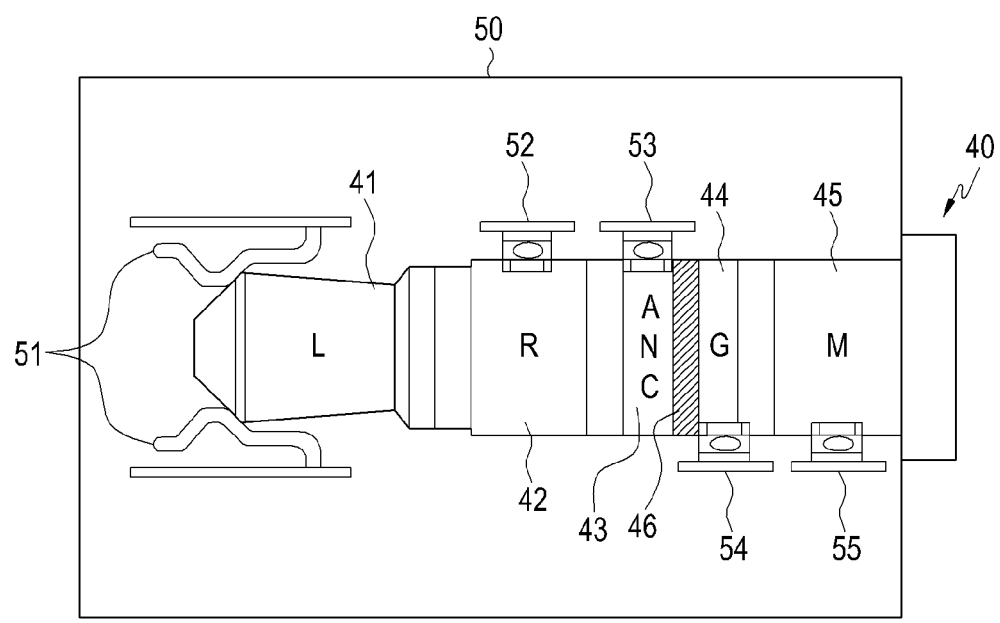
FIG. 8 is a side view illustrating a state where a connector of an audio device, such as the connector of the audio device illustrated in FIG. 7, is inserted into a connector of an electronic device according to an embodiment of the present disclosure.

FIG. 8 is a side view illustrating a state where a connector of an audio device, such as the connector of the audio device illustrated in FIG. 7, is inserted into a connector of an electronic device according to an embodiment of the present disclosure.

Referring to FIGS. 2 and 7, the audio device 250 includes the audio side connector 40, the ANC block 254, the ANC power source unit 11, and the on/off switch unit 12.

The audio side connector 40 may include a microphone terminal 45 for outputting a microphone signal to the electronic device 200, an L channel audio terminal 41 and an R channel audio terminal 42 for receiving an audio signal from the electronic device 200, and an ANC terminal 43 and a ground terminal 44 for applying power input from the electronic device 200 to the ANC block 254.

Referring to FIG. 2 mentioned above, the connectors 40, 50 of the electronic device 200 and the audio device 250 may be configured with a 5-pole connector that includes L channel audio terminals 41, 51, R channel audio terminals 42, 52, ANC terminals 43, 53, ground terminals 44, 54, and microphone terminals 45, 55. The ANC block 254 may be provided in the audio device 250 such that the ANC block 254 is driven by power input from the electronic device 200 to remove noise around the audio device 250. The ANC power source unit 11 may be provided in the electronic device 200 to apply the power to the ANC block 254 via the ANC terminals 43, 53 as drive power. The on/off switch unit 12 may be provided in the electronic device 200 to control to turn on/off the power of the ANC power source unit 11.

As illustrated in FIG. 7, the ANC terminal 43 is included in the area of the ground terminal 44 in this embodiment. Namely, in cases where the ANC terminal 43 is included in the area of the ground terminal 44, a non-contact area 46 may be provided between the ANC terminal 43 and the ground terminal 44 to partition the ANC terminal 43 and the ground terminal 44.

In other words, the non-contact area 46 may be included in the area of the ground terminal 44 to partition and divide the ground terminal 44 and the ANC terminal 43.

Accordingly, the audio side connector 40 may be configured with a 5-pole terminal while maintaining an existing jack shape based on the 3.5 mm standard as it is. In other words, the ANC terminal 43 of the audio side connector 40 may be included in the area of the existing ground terminal 44 without a change in the size of the audio side connector 40.

Likewise, the electronic device side connector 50 may be configured in a socket shape of a 5-pole terminal to correspond to the audio side connector 40 configured with the 5-pole terminal. The ANC terminal 53 of the electronic device side connector 50 may be electrically connected to the ANC terminal 43 of the audio side connector 40 without a change in the size of the electronic device side connector 50 due to the use of the existing ground terminal 54 included in the existing electronic device side connector 50.

In this state, operations of the connectors of the audio device and the electronic device will be described in more detail with reference to FIG. 8 as follows.

First, referring to FIG. 8, the 5-pole terminal connector 40 of the audio device 250 (illustrated in FIG. 2) having a jack shape is inserted into the 5-pole terminal connector 50 of the electronic device 200 (illustrated in FIG. 2) having a socket shape. At this time, the connector 40 of the audio device is electrically connected to the connector 50 of the electronic device.

In other words, the L channel audio terminal 41, the R channel audio terminal 42, the ground terminal 44, the microphone terminal 45, and the ANC terminal 43, included in the area of the ground terminal 44, of the audio side 5-pole terminal connector 40 may be connected to the L channel audio terminal 51, the R channel audio terminal 52, the ground terminal 54, the microphone terminal 55, and the ANC terminal 53 of the electronic device side 5-pole terminal connector 50, respectively.

At this time, the ANC terminal 43 of the audio side connector 40 and the ANC terminal 53 of the electronic device side connector 50 are electrically connected to each other.

As illustrated in FIGS. 2 and 8 mentioned above, when a user presses an ANC drive key (not illustrated) included in the electronic device in this state to drive the ANC block 254 (illustrated in FIG. 2), the on/off switch unit 12 is turned on and applies the power of the ANC power source unit 11 included in the electronic device to the ANC terminal 53 of the electronic device side connector 50, and the ANC terminal 53 applies the power to the ANC block 254 included in the audio device 250 via the ANC terminal 43 in the area of the ground terminal 44 to drive the ANC block 254.

At this time, the user can listen to high quality calls and music in such a noise situation at the same time that surrounding noise is removed through the driving of the ANC block 254.

In this state, in cases where the user does not use the ANC block 254 (illustrated in FIG. 2), if the user presses the ANC drive key (not illustrated) included in the electronic device again, the on/off switch unit 12 is turned off, and the power of the ANC power source unit 11 included in the electronic device 200 (illustrated in FIG. 2) is cut off. At the same time, the ANC block 254 is not supplied with power. Accordingly, the ANC block 254 does not operate.

The ANC terminal of the electronic device side connector and the ANC terminal in the area of the ground terminal of the audio side connector are provided as described above so that power can be supplied from the electronic device to the ANC block of the audio device using the existing connector.

Among elements of an audio device and an electronic device, according to yet another embodiment of the present disclosure, connectors will be hereinafter described as follows.

Also, repetitive descriptions of the electronic device 200 identical to ones given with reference to FIG. 2 will be omitted. In addition, repetitive descriptions of connectors 60, 70 of the present disclosure identical to ones of the connectors according to the preceding embodiments will be omitted, and the following description will be focused on differences therebetween.

Figure 9:
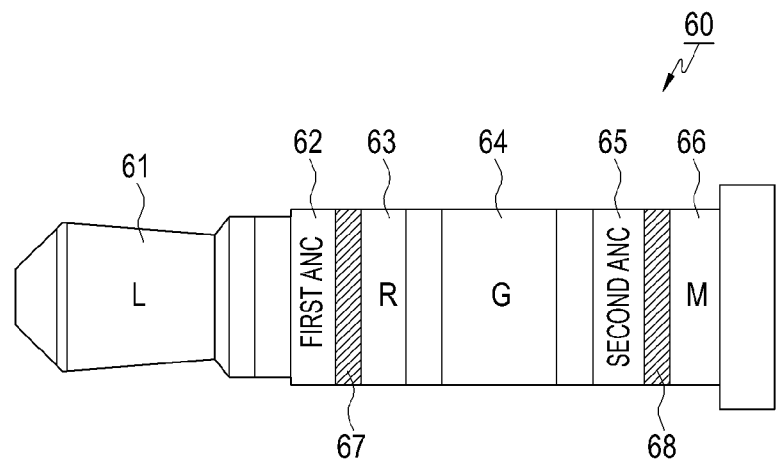
FIG. 9 is a side view illustrating a connector of an audio device according to an embodiment of the present disclosure.

FIG. 9 is a side view illustrating a connector of an audio device according to an embodiment of the present disclosure.

Figure 10:
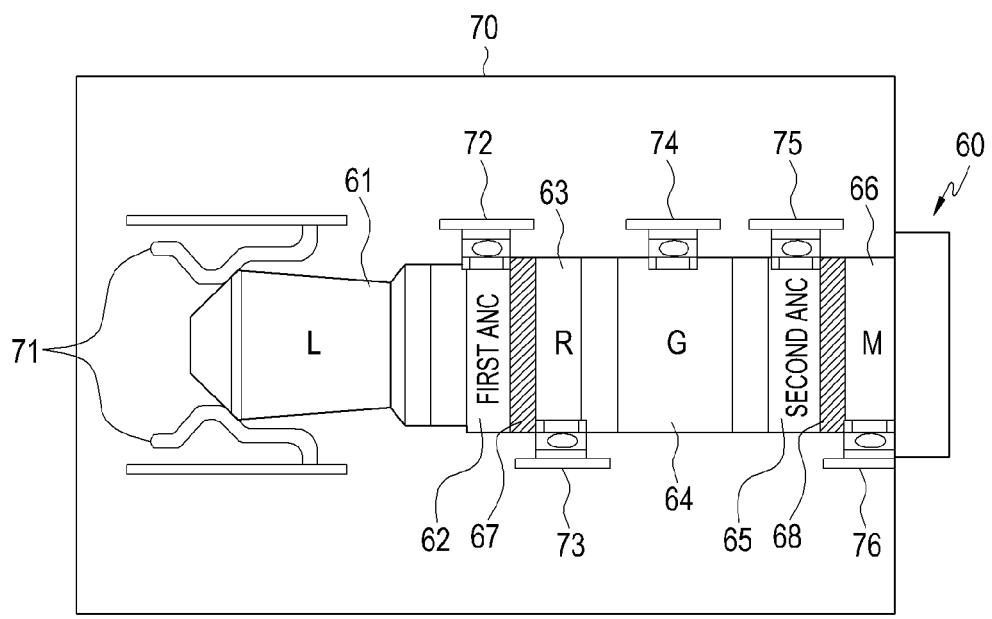
FIG. 10 is a side view illustrating a state where a connector of an audio device, such as the connector of the audio device illustrated in FIG. 9, is inserted into a connector of an electronic device according to an embodiment of the present disclosure.

FIG. 10 is a side view illustrating a state where a connector of an audio device, such as the connector of the audio device illustrated in FIG. 9, is inserted into a connector of an electronic device according to an embodiment of the present disclosure.

Referring to FIGS. 2 and 9, the audio device 250 includes the audio side connector 60, the ANC block 254, the ANC power source unit 11, and the on/off switch unit 12.

The audio side connector 60 may include a microphone terminal 66 for outputting a microphone signal to the electronic device 200, an L channel audio terminal 61 and an R channel audio terminal 63 for receiving an audio signal from the electronic device 200, and first and second ANC terminals 62, 65 and a ground terminal 64 for applying power input from the electronic device 200 to the ANC block 254.

Referring to FIGS. 2 and 10 mentioned above, the connector 60 of the audio device 250 may be configured with a 6-pole connector that includes the L channel audio terminal 61, the R channel audio terminal 63, the first and second ANC terminals 62, 65, the ground terminal 64, and the microphone terminal 66.

The connector 70 of the electronic device 200 may be configured with a 6-pole connector that includes an L channel audio terminal 71, an R channel audio terminal 73, first and second ANC terminals 72, 75, a ground terminal 74, and a microphone terminal 76.

The ANC block 254 may be provided in the audio device such that the ANC block 254 is driven by power input from the electronic device to remove noise around the audio device.

The ANC power source unit 11 may be provided in the electronic device to apply the power to the ANC block 254 via the ANC terminals 62, 65, 72, 75 as drive power.

The on/off switch unit 12 may be provided in the electronic device to control to turn on/off the power of the ANC power source unit 11.

In this embodiment, the first ANC terminal 62 is included in the area of the R channel audio terminal 63.

The second ANC terminal 65 is included in the area of the microphone terminal 66.

Namely, in cases where the first ANC terminal 62 is included in the area of the R channel audio terminal 63, a first non-contact area 67 may be provided between the first ANC terminal 62 and the R channel audio terminal 63 to partition the first ANC terminal 62 and the R channel audio terminal 63.

The first non-contact area 67 may be included in the area of the R channel audio terminal 63 to partition and divide the R channel audio terminal 63 and the first ANC terminal 62.

Further, in cases where the second ANC terminal 65 is included in the area of the microphone terminal 66, a second non-contact area 68 may be provided between the second ANC terminal 65 and the microphone terminal 66 to partition the second ANC terminal 65 and the microphone terminal 66.

In other words, the second non-contact area 68 may be included in the area of the microphone terminal 66 to partition and divide the microphone terminal 66 and the second ANC terminal 65.

Accordingly, the audio side connector 60 may be configured with a 6-pole terminal while maintaining an existing jack shape based on the 3.5 mm standard as it is. In other words, the first and second ANC terminals 62, 65 of the audio side connector 60 may be included in the area of the existing R channel audio terminal 63 and in the area of the existing microphone terminal 66 without a change in the size of the audio side connector 60.

Likewise, the electronic device side connector 70 may be configured in a socket shape of a 6-pole terminal to correspond to the audio side connector 60 configured with the 6-pole terminal. The first and second ANC terminals 72, 75 of the electronic device side connector 70 may be electrically connected to the first and second ANC terminals 62, 65 of the audio side connector 60 without a change in the size of the electronic device side connector 70 due to the use of the existing ground terminal included in the electronic device side connector.

In this state, operations of the connectors of the audio device and the electronic device will be described in more detail with reference to FIG. 10 as follows.

First, as illustrated in FIG. 10, the 6-pole terminal connector 60 of the audio device 250 (illustrated in FIG. 2) having a jack shape is inserted into the 6-pole terminal connector 70 of the electronic device having a socket shape. At this time, the connector 60 of the audio device is electrically connected to the connector 70 of the electronic device.

In other words, the audio side 6-pole terminal connector 60 is configured with the L channel audio terminal 61, the R channel audio terminal 63, the ground terminal 64, the microphone terminal 66, and the first and second ANC terminals 62, 65 included in the area of the R channel audio terminal 63 and in the area of the microphone terminal 66, and the electronic device side 6-pole terminal connector 70 is configured with the L channel audio terminal 71, the R channel audio terminal 73, the ground terminal 74, the microphone terminal 76, and the first and second ANC terminals 72, 75.

The terminals of the audio side 6-pole terminal connector 60 may be connected to the terminals of the electronic device side 6-pole terminal connector 70, respectively.

At this time, the first and second ANC terminals 62, 65 of the audio side connector are electrically connected to the first and second ANC terminals 72, 75 of the electronic device side connector, respectively.

As illustrated in FIG. 2 mentioned above, when a user presses an ANC drive key (not illustrated) included in the electronic device in this state to drive the ANC block 254, the on/off switch unit 12 is turned on and applies the power of the ANC power source unit 11 included in the electronic device to the first and second ANC terminals 72, 75 of the electronic device side connector 70, and the first and second ANC terminals 72, 75 apply the power to the ANC block 254 included in the audio device 250 via the first and second ANC terminals 62, 65 included in the area of the R channel audio terminal 63 and in the area of the microphone terminal 66 to drive the ANC block 254.

At this time, the user can listen to high quality calls and music in such a noise situation at the same time that surrounding noise is removed through the driving of the ANC block 254.

In this state, in cases where the user does not use the ANC block 254, if the user presses the ANC drive key (not illustrated) included in the electronic device again, the on/off switch unit 12 is turned off, and the power of the ANC power source unit 11 included in the electronic device is cut off. At the same time, the ANC block 254 is not supplied with power. Accordingly, the ANC block 254 does not operate.

The first and second ANC terminals of the electronic device, and the first and second ANC terminals of the audio device, included in the areas of the R channel audio terminal and the microphone terminal, are provided as described above so that power can be supplied from the electronic device to the ANC block of the audio device using the existing connector.

Among elements of an audio device and an electronic device, according to yet another embodiment of the present disclosure, connectors will be hereinafter described as follows.

Also, repetitive descriptions of the electronic device 200 identical to ones given with reference to FIG. 2 will be omitted. In addition, repetitive descriptions of connectors 80, 90 of the present disclosure identical to ones of the connectors according to the preceding embodiment will be omitted, and the following description will be focused on differences therebetween.

Figure 11:
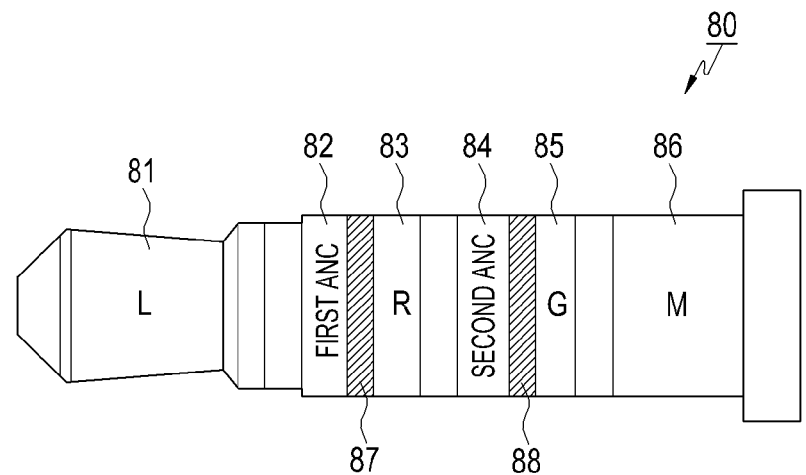
FIG. 11 is a side view illustrating a connector of an audio device according to an embodiment of the present disclosure.

FIG. 11 is a side view illustrating a connector of an audio device according to an embodiment of the present disclosure.

Figure 12:
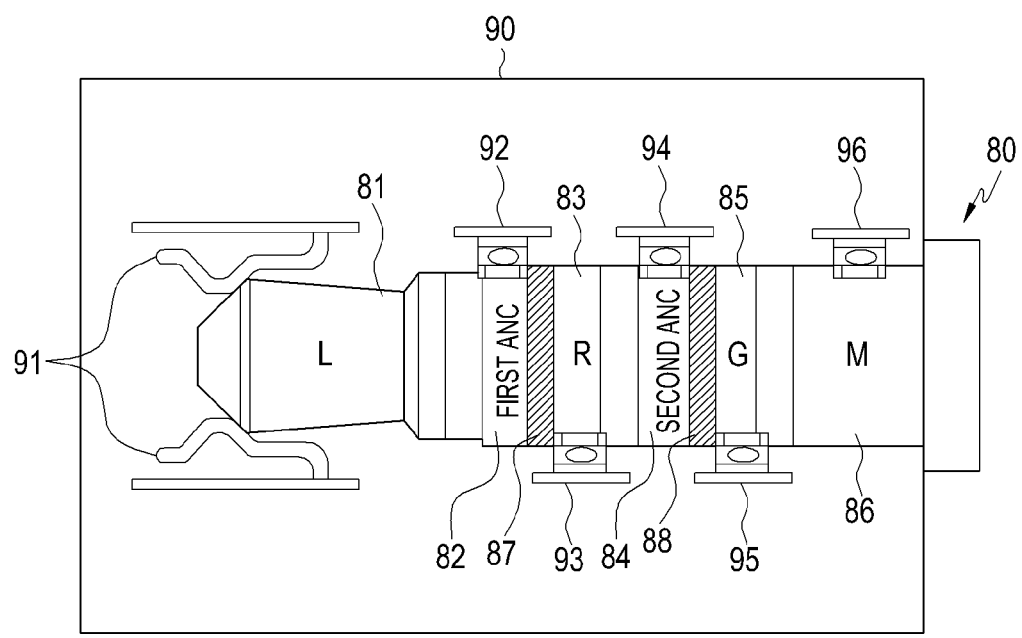
FIG. 12 is a side view illustrating a state where a connector of an audio device, such as the connector of the audio device illustrated in FIG. 11, is inserted into a connector of an electronic device according to an embodiment of the present disclosure.

FIG. 12 is a side view illustrating a state where a connector of an audio device, such as the connector of the audio device illustrated in FIG. 11, is inserted into a connector of an electronic device according to an embodiment of the present disclosure.

Referring to FIGS. 2 and 11, the audio device 250 includes the audio side connector 80, the ANC block 254, the ANC power source unit 11, and the on/off switch unit 12.

The audio side connector 80 may include a microphone terminal 86 for outputting a microphone signal to the electronic device 200, an L channel audio terminal 81 and an R channel audio terminal 83 for receiving an audio signal from the electronic device 200, and first and second ANC terminals 82, 84 and a ground terminal 85 for applying power input from the electronic device 200 to the ANC block 254.

Referring to FIGS. 2 and 12 mentioned above, the connector 80 of the audio device 250 may be configured with a 6-pole connector that includes the L channel audio terminal 81, the R channel audio terminal 83, the first and second ANC terminals 82, 84, the ground terminal 85, and the microphone terminal 86.

The connector 90 of the electronic device 200 may be configured with a 6-pole connector that includes an L channel audio terminal 91, an R channel audio terminal 93, first and second ANC terminals 92, 94, a ground terminal 95, and a microphone terminal 96.

The ANC block 254 may be provided in the audio device 250 such that the ANC block 254 is driven by power input from the electronic device to remove noise around the audio device.

The ANC power source unit 11 may be provided in the electronic device 200 to apply the power to the ANC block 254 via the ANC terminals 82, 84, 92, 94 as drive power.

The on/off switch unit 12 may be provided in the electronic device to control to turn on/off the power of the ANC power source unit 11.

In this embodiment, the first ANC terminal 82 is included in the area of the R channel audio terminal 83.

The second ANC terminal 84 is included in the area of the ground terminal 85.

Namely, in cases where the first ANC terminal 82 is included in the area of the R channel audio terminal 83, a first non-contact area 87 may be provided between the first ANC terminal 82 and the R channel audio terminal 83 to partition the first ANC terminal 82 and the R channel audio terminal 83.

The first non-contact area 87 may be included in the area of the R channel audio terminal 83 to partition and divide the R channel audio terminal 83 and the first ANC terminal 82.

Further, in cases where the second ANC terminal 84 is included in the area of the ground terminal 85, a second non-contact area 88 may be provided between the second ANC terminal 84 and the ground terminal 85 to partition the second ANC terminal 84 and the ground terminal 85.

In other words, the second non-contact area 88 may be included in the area of the ground terminal 85 to partition and divide the ground terminal 85 and the second ANC terminal 84.

Accordingly, the audio side connector 80 may be configured with a 6-pole terminal while maintaining an existing jack shape based on the 3.5 mm standard as it is. In other words, the first and second ANC terminals 82, 84 of the audio side connector 80 may be included in the area of the existing R channel audio terminal and in the area of the existing ground terminal 85 without a change in the size of the audio side connector 80.

Likewise, the electronic device side connector 90 may be configured in a socket shape of a 6-pole terminal to correspond to the audio side connector 80 configured with the 6-pole terminal. The first and second ANC terminals 92, 94 of the electronic device side connector 90 may be electrically connected to the first and second ANC terminals 82, 84 of the audio side connector 80 without a change in the size of the electronic device side connector 90 due to the use of the existing ground terminal included in the electronic device side connector 90.

In this state, operations of the connectors of the audio device and the electronic device will be described in more detail with reference to FIG. 12 as follows.

First, as illustrated in FIG. 12, the 6-pole terminal connector 80 of the audio device having a jack shape is inserted into the 6-pole terminal connector 90 of the electronic device having a socket shape. At this time, the connector 80 of the audio device is electrically connected to the connector 90 of the electronic device.

In other words, the audio side 6-pole terminal connector 80 is configured with the L channel audio terminal 81, the R channel audio terminal 83, the ground terminal 85, the microphone terminal 86, and the first and second ANC terminals 82, 84 included in the area of the R channel audio terminal 83 and in the area of the ground terminal 85, and the electronic device side 6-pole terminal connector 90 is configured with the L channel audio terminal 91, the R channel audio terminal 93, the ground terminal 95, the microphone terminal 96, and the first and second ANC terminals 92, 94.

The terminals of the audio side 6-pole terminal connector 80 may be connected to the terminals of the electronic device side 6-pole terminal connector 90, respectively.

At this time, the first and second ANC terminals 82, 84 of the audio side connector 80 are electrically connected to the first and second ANC terminals 92, 94 of the electronic device side connector 90, respectively.

As illustrated in FIG. 2 mentioned above, when a user presses an ANC drive key (not illustrated) included in the electronic device in this state to drive the ANC block 254, the on/off switch unit 12 is turned on and applies the power of the ANC power source unit 11 included in the electronic device to the first and second ANC terminals 92, 94 of the electronic device side connector 90, and the first and second ANC terminals 92, 94 apply the power to the ANC block 254 included in the audio device 250 via the first and second ANC terminals 82, 84 included in the area of the R channel audio terminal 83 and in the area of the ground terminal 85 to drive the ANC block 254.

At this time, the user can listen to high quality calls and music in such a noise situation at the same time that surrounding noise is removed through the driving of the ANC block 254.

In this state, in cases where the user does not use the ANC block 254, if the user presses the ANC drive key (not illustrated) included in the electronic device again, the on/off switch unit 12 is turned off, and the power of the ANC power source unit 11 included in the electronic device is cut off. At the same time, the ANC block 254 is not supplied with power. Accordingly, the ANC block 254 does not operate.

The first and second ANC terminals of the electronic device, and the first and second ANC terminals of the audio device, included in the areas of the R channel audio terminal and the ground terminal, are provided as described above so that power can be supplied from the electronic device to the ANC block of the audio device using the existing connector.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An audio device connected to an electronic device, the electronic device comprising a power source and an on/off switch that controls the power source, the audio device comprising:
    an audio side connector comprising:
        a microphone terminal,
        at least one audio terminal,
        an additional function terminal, and
        a ground terminal; and
    an additional function circuit configured to receive a power input from the electronic device to execute an additional function,
    wherein the additional function terminal is configured to provide power from the power source to the additional function circuit as drive power, and
    wherein the additional function terminal is included in at least one of the microphone terminal, the audio terminal, and the ground terminal and a non-contact area is further provided between the additional function terminal and the at least one of the microphone terminal, the audio terminal, and the ground terminal.

2. The audio device of claim 1, wherein the additional function circuit comprises an active noise cancelling (ANC) block.

3. An audio device connected to an electronic device, the electronic device comprising an active noise canceling (ANC) power source and an on/off switch that controls the ANC power source, the audio device comprising:
an audio side connector comprising:
a microphone terminal configured to output a microphone signal to the electronic device,
at least one audio terminal configured to receive an audio signal from the electronic device,
an ANC terminal, and
a ground terminal; and
an ANC block configured to receive a power input from the electronic device to remove noise around the audio device,
wherein the ANC terminal is configured to provide power from the ANC power source to the ANC block as drive power, and
wherein the ANC terminal is included in any one of the areas of the microphone terminal, the audio terminal, and the ground terminal and a non-contact area is further provided between the ANC terminal and the at least one of the microphone terminal, the audio terminal, and the ground terminal.

4. The audio device of claim 3, wherein the audio terminal comprises a left (L) channel audio terminal and a right (R) channel audio terminal.

5. The audio device of claim 4, wherein, when the ANC terminal is included in the area of the audio terminal, the non-contact area is further provided between the ANC terminal and the R channel audio terminal to partition the ANC terminal and the R channel audio terminal in the area of the audio terminal.

6. The audio device of claim 3, wherein the electronic device is equipped with an electronic device side connector comprising:
a microphone terminal;
at least one audio terminal;
an ANC terminal; and
a ground terminal,
wherein the microphone terminal, the at least one audio terminal, the ANC terminal, and the ground terminal of the electronic device side connector are electrically connected to the terminals of the audio side connector, respectively.

7. The audio device of claim 3, wherein the electronic device further comprises a popup prevention circuit device that is able to remove popup noise generated when the ANC power source supplies electric power to the audio device or cuts off the power supply via the on/off switch.

8. An audio device connected to an electronic device, the electronic device comprising an active noise canceling (ANC) power source and an on/off switch that controls the ANC power source, the audio device comprising:
an audio side connector comprising:
a microphone terminal configured to output a microphone signal to the electronic device,
at least one audio terminal configured to receive an audio signal from the electronic device,
an ANC terminal, and
a ground terminal; and
an ANC block configured to receive a power input from the electronic device to remove noise around the audio device,
wherein the ANC terminal is configured to provide power from the ANC power source to the ANC block as drive power, and
wherein the ANC terminal is included in the area of the microphone terminal and a non-contact area is further provided between the ANC terminal and the microphone terminal.

9. The audio device of claim 8, wherein the electronic device is equipped with an electronic device side connector comprising:
a microphone terminal;
at least one audio terminal;
an ANC terminal; and
a ground terminal,
wherein the microphone terminal, the at least one audio terminal, the ANC terminal, and the ground terminal of the electronic device side connector are electrically connected to the terminals of the audio side connector, respectively.

10. An audio device connected to an electronic device, the electronic device comprising an active noise canceling (ANC) power source and an on/off switch that controls the ANC power source, the audio device comprising:
an audio side connector comprising:
a microphone terminal configured to output a microphone signal to the electronic device,
at least one audio terminal configured to receive an audio signal from the electronic device,
an ANC terminal, and
a ground terminal; and
an ANC block configured to receive a power input from the electronic device to remove noise around the audio device;
wherein the ANC terminal is configured to provide power from the ANC power source to the ANC block as drive power, and
wherein the ANC terminal is included in the area of the ground terminal and a non-contact area is further provided between the ANC terminal and the ground terminal.

11. The audio device of claim 10, wherein the electronic device is equipped with an electronic device side connector comprising:
a microphone terminal;
at least one audio terminal;
an ANC terminal; and
a ground terminal,
wherein the microphone terminal, the at least one audio terminal, the ANC terminal, and the ground terminal of the electronic device side connector are electrically connected to the terminals of the audio side connector, respectively.

12. An audio device connected to an electronic device, the electronic device comprising an active noise canceling (ANC) power source and an on/off switch that controls the ANC power source, the audio device comprising:
an audio side connector comprising:
a microphone terminal configured to output a microphone signal to the electronic device,
at least one audio terminal configured to receive an audio signal from the electronic device,
a first and a second ANC terminal, and
a ground terminal; and
an ANC block configured to receive a power input from the electronic device to remove noise around the audio device,
wherein the ANC terminals are configured to provide power from the ANC power source to the ANC block as drive power, and wherein the first ANC terminal is included in the area of the audio terminal, and the second ANC terminal is included in the area of the microphone terminal and a first non-contact area is further provided between the first ANC terminal and the audio terminal.

13. The audio device of claim 12, wherein a second non-contact area is further provided between the second ANC terminal and the microphone terminal to partition the second ANC terminal and the microphone terminal in the area of the microphone terminal.

14. The audio device of claim 12, wherein the electronic device is equipped with an electronic device side connector comprising:
a microphone terminal;
at least one audio terminal;
a first and a second ANC terminal; and
a ground terminal,
wherein the microphone terminal, the at least one audio terminal, the first and second ANC terminals, and the ground terminal of the electronic device side connector are electrically connected to the terminals of the audio side connector, respectively.

15. An audio device connected to an electronic device, the electronic device comprising an active noise canceling (ANC) power source and an on/off switch that controls the ANC power source, the audio device comprising:
an audio side connector comprising:
a microphone terminal configured to output a microphone signal to the electronic device,
at least one audio terminal configured to receive an audio signal from the electronic device,
a first and a second ANC terminal, and
a ground terminal; and
an ANC block configured to receive a power input from the electronic device to remove noise around the audio device,
wherein the ANC terminals are configured to provide power from the ANC power source to the ANC block as drive power, and
wherein the first ANC terminal is included in the area of the audio terminal, and the second ANC terminal is included in the area of the ground terminal and a first non-contact area is further provided between the first ANC terminal and the audio terminal.

16. The audio device of claim 15, wherein a second non-contact area is further provided between the second ANC terminal and the ground terminal to partition the second ANC terminal and the ground terminal in the area of the ground terminal.

17. The audio device of claim 15, wherein the electronic device is equipped with an electronic device side connector comprising:
a microphone terminal;
at least one audio terminal;
a first and a second ANC terminal; and
a ground terminal,
wherein the microphone terminal, the at least one audio terminal, the first and second ANC terminals, and the ground terminal of the electronic device side connector are electrically connected to the terminals of the audio side connector, respectively.

18. An earphone for connection to an electronic device, the electronic device comprising a power source and an on/off switch that controls the power source, the earphone comprising:
an earphone side connector comprising:
a microphone terminal,
at least one earphone terminal,
an additional function terminal, and
a ground terminal; and
an additional function circuit configured to receive a power input from the electronic device to execute an additional function;
wherein the additional function terminal is configured to provide power from the power source to the additional function circuit as drive power, and
wherein the additional function terminal is included in any one of the microphone terminal, the earphone terminal, and the ground terminal and a non-contact area is further provided between the additional function terminal and the any one of the microphone terminal, the earphone terminal, and the ground terminal.

19. The earphone of claim 18, wherein the additional function circuit comprises an active noise cancelling (ANC) block.

20. An earphone for connection to an electronic device, the electronic device comprising an active noise canceling (ANC) power source and an on/off switch that controls the ANC power source, the earphone comprising:
an earphone side connector comprising:
a microphone terminal configured to output a microphone signal to the electronic device,
at least one earphone terminal configured to receive an earphone signal from the electronic device,
an ANC terminal, and
a ground terminal; and
an ANC block configured to receive a power input from the electronic device to remove noise around the earphone,
wherein the ANC terminal is configured to provide power from the ANC power source to the ANC block as drive power, and
wherein the ANC terminal is included in any one of the areas of the microphone terminal, the earphone terminal, and the ground terminal and a non-contact area is further provided between the ANC terminal and the any one of the areas of the microphone terminal, the earphone terminal, and the ground terminal.

21. The earphone of claim 20, wherein the earphone terminal comprises a left (L) channel earphone terminal and a right (R) channel earphone terminal.

22. The earphone of claim 21, wherein, when the ANC terminal is included in the area of the earphone terminal, the non-contact area is further provided between the ANC terminal and the R channel earphone terminal to partition the ANC terminal and the R channel earphone terminal in the area of the earphone terminal.

23. The earphone of claim 20, wherein the electronic device is equipped with an electronic device side connector comprising:
a microphone terminal;
at least one earphone terminal;
an ANC terminal; and
a ground terminal,
wherein the microphone terminal, the at least one earphone terminal, the ANC terminal, and the ground terminal of the electronic device side connector are electrically connected to the terminals of the earphone side connector, respectively.

24. The earphone of claim 20, wherein the electronic device further comprises a popup prevention circuit device that is able to remove popup noise generated when the ANC power source supplies electric power to the earphone or cuts off the power supply via the on/off switch.

25. An earphone for connection to an electronic device, the electronic device comprising an active noise canceling (ANC) power source and an on/off switch that controls the ANC power source, the earphone comprising:
- an earphone side connector comprising:
  - a microphone terminal configured to output a microphone signal to the electronic device,
  - at least one earphone terminal configured to receive an earphone signal from the electronic device,
  - an ANC terminal, and
  - a ground terminal; and
- an ANC block configured to receive a power input from the electronic device to remove noise around the earphone,
- wherein the ANC terminal is configured to provide power from the ANC power source to the ANC block as drive power, and
- wherein the ANC terminal is included in the area of the microphone terminal and a non-contact area is further provided between the ANC terminal and the microphone terminal.

26. The earphone of claim 25, wherein the electronic device is equipped with an electronic device side connector comprising:
- a microphone terminal;
- at least one earphone terminal;
- an ANC terminal; and
- a ground terminal,
- wherein the microphone terminal, the at least one earphone terminal, the ANC terminal, and the ground terminal of the electronic device side connector are electrically connected to the terminals of the earphone side connector, respectively.

27. An earphone connected to an electronic device, the electronic device comprising an active noise canceling (ANC) power source and an on/off switch that controls the ANC power source, the earphone comprising:
- an earphone side connector comprising:
  - a microphone terminal configured to output a microphone signal to the electronic device,
  - at least one earphone terminal configured to receive an earphone signal from the electronic device,
  - an ANC terminal, and
  - a ground terminal; and
- an ANC block configured to receive a power input from the electronic device to remove noise around the earphone;
- wherein the ANC terminal is configured to provide power from the ANC power source to the ANC block as drive power, and
- wherein the ANC terminal is included in the area of the ground terminal and a non-contact area is further provided between the ANC terminal and the ground terminal.

28. The earphone of claim 27, wherein the electronic device is equipped with an electronic device side connector comprising:
- a microphone terminal;
- at least one earphone terminal;
- an ANC terminal; and
- a ground terminal,
- wherein the microphone terminal, the at least one earphone terminal, the ANC terminal, and the ground terminal of the electronic device side connector are electrically connected to the terminals of the earphone side connector, respectively.

29. An earphone connected to an electronic device, the electronic device comprising an active noise canceling (ANC) power source and an on/off switch that controls the ANC power source, the earphone comprising:
- an earphone side connector comprising:
  - a microphone terminal configured to output a microphone signal to the electronic device,
  - at least one earphone terminal configured to receive an earphone signal from the electronic device,
  - a first and a second ANC terminal, and
  - a ground terminal; and
- an ANC block configured to receive a power input from the electronic device to remove noise around the earphone,
- wherein the ANC terminals are configured to provide power from the ANC power source to the ANC block as drive power, and
- wherein the first ANC terminal is included in the area of the earphone terminal and the second ANC terminal is included in the area of the microphone terminal and a first non-contact area is further provided between the first ANC terminal and the earphone terminal.

30. The earphone of claim 29, wherein a second non-contact area is further provided between the second ANC terminal and the microphone terminal to partition the second ANC terminal and the microphone terminal in the area of the microphone terminal.

31. The earphone of claim 29, wherein the electronic device is equipped with an electronic device side connector comprising:
- a microphone terminal;
- at least one earphone terminal;
- a first and a second ANC terminal; and
- a ground terminal,
- wherein the microphone terminal, the at least one earphone terminal, the first and second ANC terminals, and the ground terminal of the electronic device side connector are electrically connected to the terminals of the earphone side connector, respectively.

32. An earphone connected to an electronic device, the electronic device comprising an active noise canceling (ANC) power source and an on/off switch that controls the ANC power source, the earphone comprising:
- an earphone side connector comprising:
  - a microphone terminal configured to output a microphone signal to the electronic device,
  - at least one earphone terminal configured to receive an earphone signal from the electronic device,
  - a first and a second ANC terminal, and
  - a ground terminal; and
- an ANC block configured to receive a power input from the electronic device to remove noise around the earphone,
- wherein the ANC terminals are configured to provide power from the ANC power source to the ANC block as drive power, and
- wherein the first ANC terminal is included in the area of the earphone terminal, and the second ANC terminal is included in the area of the ground terminal and a first non-contact area is further provided between the first ANC terminal and the earphone terminal.

33. The earphone of claim 32, wherein a second non-contact area is further provided between the second ANC terminal and the ground terminal to partition the second ANC terminal and the ground terminal in the area of the ground terminal.

34. The earphone of claim 32, wherein the electronic device is equipped with an electronic device side connector comprising:
- a microphone terminal;
- at least one earphone terminal;
- a first and a second ANC terminal; and
- a ground terminal,
- wherein the microphone terminal, the at least one earphone terminal, the first and second ANC terminals, and the ground terminal of the electronic device side connector are electrically connected to the terminals of the earphone side connector, respectively.

* * * * *